(12) United States Patent
Marsili et al.

(10) Patent No.: US 10,481,214 B2
(45) Date of Patent: Nov. 19, 2019

(54) BATTERY TEMPERATURE DETECTION

(71) Applicant: Infineon Technologies AG, Neubiberg (DE)

(72) Inventors: Stefano Marsili, Faak am See (AT); Christoph Sandner, Villach (AT); Johannes Thielmann, Villach (AT)

(73) Assignee: Infineon Technologies AG, Neubiberg (DE)

( * ) Notice: Subject to any disclaimer, the term of this patent is extended or adjusted under 35 U.S.C. 154(b) by 236 days.

(21) Appl. No.: 15/419,687

(22) Filed: Jan. 30, 2017

(65) Prior Publication Data
US 2018/0217209 A1 Aug. 2, 2018

(51) Int. Cl.
| | | |
|---|---|---|
| G01R 31/389 | (2019.01) | |
| H01M 10/0525 | (2010.01) | |
| G01R 31/36 | (2019.01) | |
| H01M 10/48 | (2006.01) | |
| G01R 31/382 | (2019.01) | |
| G01K 7/16 | (2006.01) | |
| G01K 7/42 | (2006.01) | |

(52) U.S. Cl.
CPC ............ *G01R 31/389* (2019.01); *G01K 7/16* (2013.01); *G01K 7/42* (2013.01); *G01R 31/3648* (2013.01); *G01R 31/382* (2019.01); *H01M 10/0525* (2013.01); *H01M 10/486* (2013.01); *G01K 2217/00* (2013.01); *H01M 2220/20* (2013.01)

(58) Field of Classification Search
CPC ............ G01R 31/3662; H01M 10/486; H01M 10/0525; H01M 2220/20; G01K 7/16
See application file for complete search history.

(56) References Cited

U.S. PATENT DOCUMENTS

| | | | |
|---|---|---|---|
| 6,222,369 B1* | 4/2001 | Champlin ............ | G01R 31/367 324/430 |
| 9,322,884 B2* | 4/2016 | Luo ........................ | G01R 27/02 |
| 2005/0021254 A1* | 1/2005 | Merl ..................... | G01R 31/389 702/65 |
| 2012/0105070 A1* | 5/2012 | van Lammeren .... | G01R 31/389 324/430 |
| 2012/0155507 A1* | 6/2012 | Srinivasan .............. | H01M 2/34 374/45 |

(Continued)

OTHER PUBLICATIONS

L.H.J. Raijmakers et al., "Sensorless battery temperature measurements based on electrochemical impedance spectroscopy," Journal of Power Sources, vol. 247, Sep. 2013, pp. 539-544.

(Continued)

*Primary Examiner* — Stephanie E Bloss
(74) *Attorney, Agent, or Firm* — Shumaker & Sieffert, P.A.

(57) ABSTRACT

A method and a temperature detection circuit are disclosed. An example of the method includes driving an alternating current with a first frequency into a battery and detecting an imaginary part of a battery impedance at the first frequency; driving an alternating current with a second frequency different from the first frequency into the battery and detecting an imaginary part of the battery impedance at the second frequency; and calculating an intercept frequency at which the imaginary part equals a predefined value at least based on the imaginary part obtained at the first frequency and the imaginary part obtained at the second frequency.

32 Claims, 7 Drawing Sheets

(56) References Cited

U.S. PATENT DOCUMENTS

| | | | | |
|---|---|---|---|---|
| 2012/0280693 A1* | 11/2012 | Lammers | ............ | H01M 10/48 |
| | | | | 324/430 |
| 2012/0303208 A1* | 11/2012 | Hariharan | ............ | H01M 10/48 |
| | | | | 701/32.9 |
| 2013/0185008 A1* | 7/2013 | Itabashi | ............ | H01M 10/486 |
| | | | | 702/63 |
| 2013/0307487 A1* | 11/2013 | Matthe | ............... | H01M 10/486 |
| | | | | 320/152 |
| 2013/0314049 A1* | 11/2013 | van Lammeren | ...... | G01K 1/026 |
| | | | | 320/134 |
| 2015/0104673 A1* | 4/2015 | de Greef | .............. | H04L 12/437 |
| | | | | 429/7 |
| 2015/0288213 A1* | 10/2015 | van Lammeren | ..... | H02J 7/0077 |
| | | | | 320/153 |
| 2016/0349329 A1* | 12/2016 | Wada | ................... | G01R 31/367 |
| 2018/0156872 A1* | 6/2018 | Oguma | ............... | G01R 31/389 |

OTHER PUBLICATIONS

L.H.J Raijmakers et al., "Non-Zero Intercept Frequency: An Accurate Method to Determine the Integral Temperature of Li-Ion Batteries," IEEE Transactions on Industrial Electronics, vol. 63, No. 5, May 2016, pp. 3168-3178.

* cited by examiner

BATTERY TEMPERATURE DETECTION

TECHNICAL FIELD

This disclosure relates in general to detecting the temperature of a battery. In particular, this disclosure relates to a sensor-less battery temperature detection.

BACKGROUND

Detecting or measuring the temperature of a battery, such as a lithium-ion (Li-ion) battery, may include driving an alternating current with a varying frequency into the battery, measuring a complex impedance of the battery at each frequency of the current in order to detect the frequency at which an imaginary part of the impedance is zero, and detecting the temperature based on this frequency at which the imaginary part of the impedance is zero. This method, which is known as ZIF (Zero Intercept Frequency) method is based on the fact that the imaginary part of the battery impedance is dependent on the temperature in such a way that at a given temperature the imaginary part of the battery impedance of batteries of a certain type intercepts zero at essentially the same frequency. This frequency where the imaginary part of the impedance intercepts zero is referred to as ZIF. Usually, the ZIF of a certain battery type is the higher the lower the temperature is. For each battery type the ZIF can be detected at different known temperatures (by the battery manufacturer, for example) and each of these known temperatures can be associated with a respective ZIF so as to obtain a plurality of ZIF-temperature pairs. At an application site of the battery, the temperature can be detected by detecting the ZIF, wherein the temperature is the temperature associated with the detected ZIF.

In some types of batteries, such as high quality automotive batteries, the ZIF, especially at high temperatures, may occur at relatively low frequencies. Measurements at low frequencies, however, may be affected by noise (interferences) such as interferences generated by an electric motor in an automobile. Such interferences may make measurements at low frequencies less reliable than measurements at higher frequencies.

Another approach, which is referred to as NZIF (Non Zero Intercept Frequency), is to detect those frequencies where the imaginary part of the battery impedance equals a predefined value different from zero. Each of these frequencies is associated with a certain temperature so that, similar to the ZIF method, the temperature can be detected by detecting the frequency where the imaginary part of the battery impedance equals the predefined value. A frequency where the imaginary part intercepts the predefined value different from zero is referred to as NZIF. The predefined value can be selected such that the NZIFs are higher than the ZIFs so that interferences are less likely to occur in the NZIF method. The NZIF method, however, requires a precise detection or measurement of the imaginary part of the battery impedance in order to detect when the imaginary part equals the predefined value.

Further, in both the ZIF method and the NZIF method, measurements at a plurality of different frequencies are required. This is time consuming.

There is therefore a need for an improved sensor-less battery temperature detection.

SUMMARY

One example relates to a method. The method includes driving an alternating current with a first frequency into a battery and detecting an imaginary part of a battery impedance at the first frequency, driving an alternating current with a second frequency different from the first frequency into the battery and detecting an imaginary part of the battery impedance at the second frequency, and calculating an intercept frequency at which the imaginary part equals a predefined value at least based on the imaginary part obtained at the first frequency and the imaginary part obtained at the second frequency.

Another example relates to a temperature detection circuit. The temperature detection circuit is configured to drive an alternating current with a first frequency into a battery and detect an imaginary part of a battery impedance at the first frequency, drive an alternating current with a second frequency different from the first frequency into the battery and detect an imaginary part of the battery impedance at the second frequency, and calculate an intercept frequency at which the imaginary part equals a predefined value at least based on the imaginary part obtained at the first frequency and the imaginary part obtained at the second frequency.

BRIEF DESCRIPTION OF THE DRAWINGS

Examples are explained below with reference to the drawings. The drawings serve to illustrate certain principles, so that only aspects necessary for understanding these principles are illustrated. The drawings are not to scale. In the drawings the same reference characters denote like features.

DETAILED DESCRIPTION

In the following detailed description, reference is made to the accompanying drawings. The drawings form a part of the description and for the purpose of illustration show examples of how the invention may be used and implemented. It is to be understood that the features of the various embodiments described herein may be combined with each other, unless specifically noted otherwise.

Figure 1:
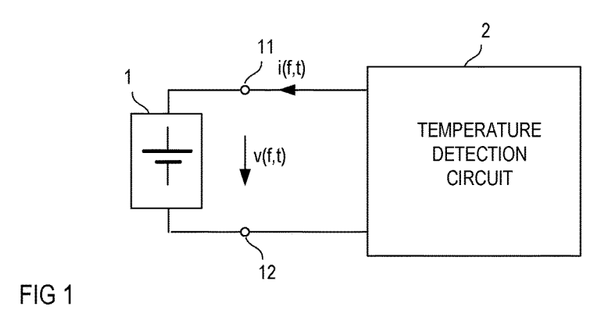
FIG. 1 schematically illustrates an arrangement with a battery and temperature detection circuit connected to the battery and configured to detect a temperature of the battery.

FIG. 1 schematically illustrates an arrangement with a battery 1 and a temperature detection circuit 2. The temperature detection circuit is connected to a first battery node 11 and a second battery node 12 of the battery 1 and is configured to detect a temperature of the battery 1 in a way explained in further detail herein below.

The battery 1 is a lithium-ion (Li-ion) battery, for example. The battery 1 includes at least one battery cell. Some examples of how the battery 1 may be implemented are illustrated in FIGS. 2A to 2D.

Figure 2A:
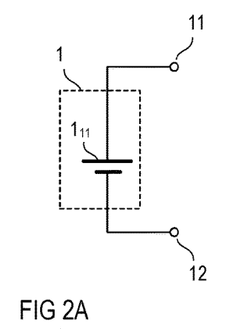
FIGS. 2A-2D show different examples of a battery.
Figure 2B:
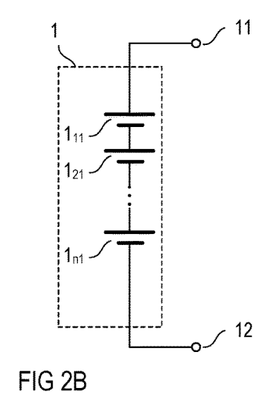
Figure 2C:
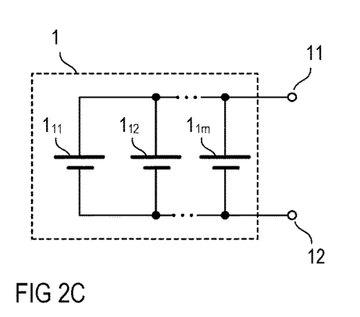
Figure 2D:
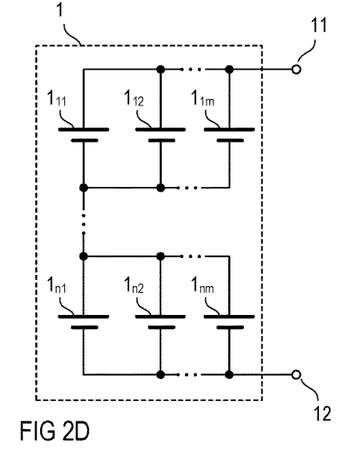

Referring to FIG. 2A, the battery 1 may include one battery cell $1_{11}$ connected between the first battery node 11 and the second battery node 12. According to another example shown in FIG. 2B, the battery 1 includes a plurality of battery cells $1_{11}, 1_{21}, 1_{n1}$ connected in series between the first battery node 11 and the second battery node 12. According to another example shown in FIG. 2C, the battery 1 includes a plurality of battery cells $1_{11}, 1_{12}, 1_{1m}$ connected in parallel between the first battery node 11 and the second battery node 12. According to yet another example shown in FIG. 2D, the battery one includes a series circuit with two or more parallel circuits, wherein each of these parallel circuits includes two or more battery cells $1_{11}, 1_{12}, 1_{1m}, 1_{n1}, 1_{n2}, 1_{nm}$.

Detecting the battery temperature by the temperature detection circuit 2 shown in FIG. 1 includes driving an alternating current i(f,t) via the battery nodes 11, 12 into the battery 1 and measuring a complex impedance Z(f) of the battery 1. The current i(f,t) is also referred to as input current in the following. Measuring the impedance Z(f) includes measuring a voltage v(f,t) between the battery nodes 11, 12. When the current i(f,t) driven into the battery 1 is an alternating current the voltage v(f,t) between the battery nodes 11, 12 is an alternating voltage.

As used herein, an "alternating current" is a current that includes an alternating current component and that, additionally, may include a direct current (DC) offset. According to one example, the alternating current component is a sinusoidal current component. In the following, an alternating current with a sinusoidal current component is referred to as sinusoidal current. A sinusoidal input current i(f,t) is given by $$i(f,t)=I_{DC}+I_0 \cdot \sin(\omega t) \quad (1),$$

where $I_0$ is an amplitude of the sinusoidal current component, $\omega=2\pi \cdot f$, and $I_{DC}$ is the optional DC offset. As used herein, "driving a current into the battery" may include driving only a positive current that charges the battery, only a negative current that discharges the battery, or alternatingly a positive current and a negative current. If in the example given in equation (1) the DC offset $I_{DC}$ is zero ($I_{DC}=0$), there are time periods when the current is positive so that the battery 1 is charged and time periods when the current is negative so that the battery is discharged, wherein over each period of the sinusoidal input current i(f,t) the charging state of the battery 1 does not change. According to another example, the DC offset $I_{DC}$ is different from zero and selected such that the input current is either only positive or only negative, wherein the current direction of the input current i(f,t) can be adjusted by selecting the sign (positive or negative) of the DC offset $I_{DC}$.

Using a sinusoidal current as the alternating input current i(f,t) is only an example. Alternating currents with alternating current components that have a waveform different from a sinusoidal waveform may be used as well. Examples of these other types of waveforms include, but are not restricted to, a rectangular waveform, a triangular waveform, a sine square waveform, or the like.

When the input current i(f,t) is a sinusoidal current as given in equation (1) the voltage v(f,t) between the battery nodes 11, 12 is an alternating voltage as follows:

$$v(f,t)=V_0+Z_0 \cdot (I_{DC}+I_0 \cdot \sin(\omega t+\varphi)) \quad (2),$$

where $Z_0$ is the magnitude of a complex impedance of the battery 1, $\varphi$ is a phase shift introduced by the complex impedance of the battery. Further, $V_0$ is an optional offset of the battery voltage v(f,t). This offset $V_0$ represents a charging state of the battery 1, that is $V_0$ is the voltage that can be measured between the battery nodes 11, 12 when no input current (i(f,t)=0) is driven into the battery 1. In general, the complex impedance Z(f) of the battery 1 can be written as $$Z(f)=Z_0 \cdot e^{j\varphi}=\text{Re}\{Z(f)\}+j \cdot \text{Im}\{Z(f)\}=Z_0 \cdot \cos \varphi + j \cdot Z_0 \cdot \sin \varphi \quad (3),$$

where Re{Z(f)} is the real part and Im{Z(f)} is the imaginary part of the complex battery impedance Z(f), and j is the imaginary unit. The real part Re{Z(f)} can also be referred to as resistance and the imaginary part Im{Z(f)} can also be referred to as reactance of the battery 1. The impedance Z(f) is dependent on the frequency f of the input current i(f,t), so that the magnitude $Z_0$ and the phase $\varphi$ of the impedance Z(f) are also dependent on the frequency (are a function of the frequency), that is, $Z_0=Z_0(f)$ and $\varphi=\varphi(f)$.

Figure 3:
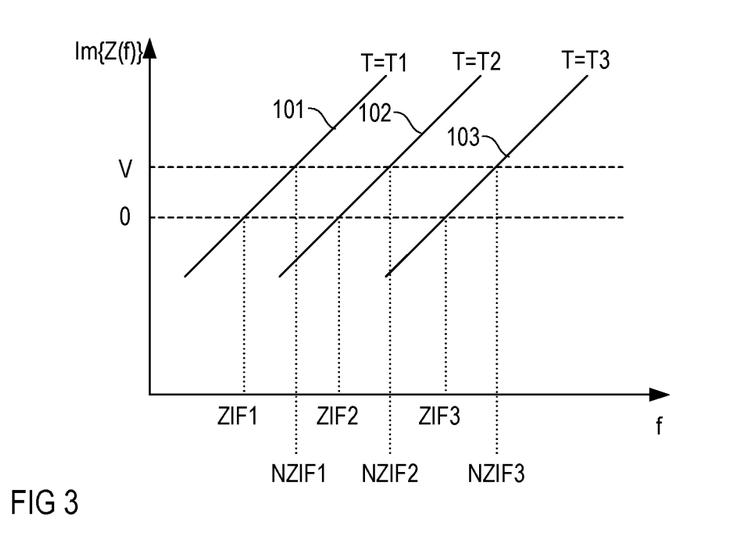
FIG. 3 schematically illustrates how an imaginary part of a complex battery impedance is dependent on a battery temperature and a frequency of a current driven into the battery.

It is known that the imaginary part Im{Z(f)} of the impedance Z(f) is dependent on the frequency f of the input current i(f,t) and the battery temperature T. This is schematically illustrated in FIG. 3. For the purpose of illustration, FIG. 3 illustrates three curves 101, 102, 103, wherein each of these curves represents the imaginary part Im{Z(f)} of the impedance Z(f) dependent on the frequency f of the input current i(f,t) at a certain temperature T1, T2, T3. As can be seen from FIG. 3 the imaginary part Im{Z(f)} of the impedance Z(f), at each of the temperatures T1, T2, T3 shown in FIG. 3, is essentially linearly dependent on the frequency f.

The ZIF method explained above detects the frequency at which the imaginary part Im{Z(f)} is zero. Those frequencies are referred to ZIF1, ZIF2, ZIF3 in FIG. 3. Each of these frequencies, which are also referred to as zero intercept frequencies (ZIFs), is associated with one temperature (T1, T2, T3 in FIG. 3) so that based on these ZIFs the battery temperature can be detected. In the NZIF method explained above the frequency is detected where the imaginary part Im{Z(f)} equals a predefined value V that is different from zero. This frequency is referred to as non-zero intercept frequency (NZIF). In the example shown in FIG. 3 the NZIFs are referred to as NZIF1, NZIF2, NZIF3. Both, the ZIF method and the NZIF method, however, require that the imaginary part Im{Z(f)} of the battery impedance Z(f) is measured at a plurality of different frequencies f. This is time consuming.

Figure 4:
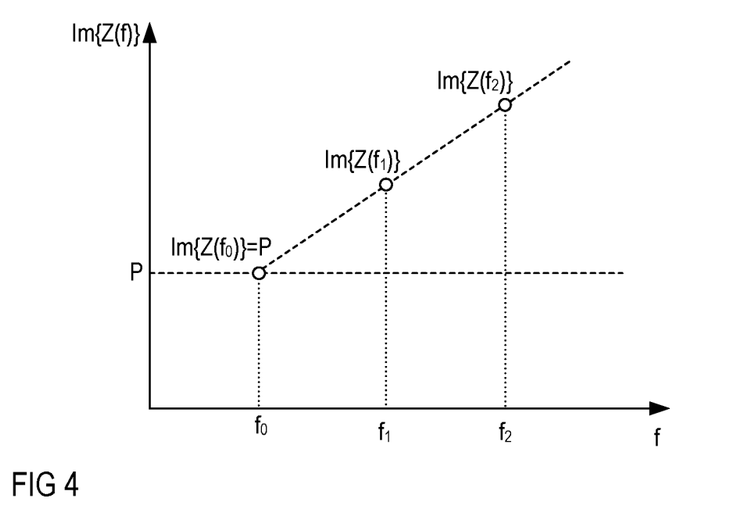
FIG. 4 illustrates one example of how a frequency at which the imaginary part of the battery equals a predefined value can be obtained based on imaginary parts of the battery impedance obtained at two different frequencies.
Figure 5:
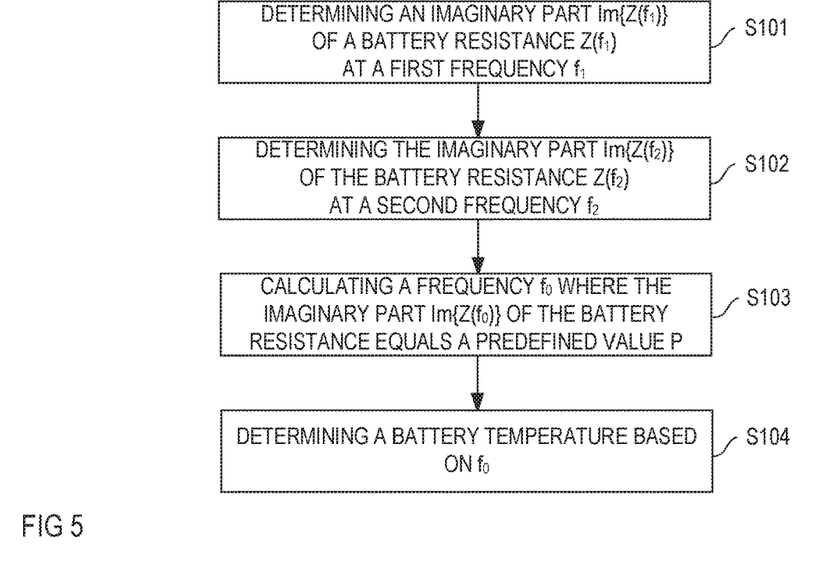
FIG. 5 shows a flow diagram that illustrates one example of a method for detecting a battery temperature based on measuring the imaginary part of the battery impedance at two different frequencies.

An alternative approach to detect the battery temperature is illustrated in FIG. 4. A flow chart of the method illustrated in FIG. 4 is shown in FIG. 5. Referring to FIGS. 4 and 5, the method includes determining an imaginary part Im{Z($f_1$)} of a battery impedance Z($f_1$) at a first frequency f1 (in step S101 shown in FIG. 5), and determining the imaginary part Im{Z($f_2$)} of the battery impedance Z($f_2$) at a second frequency f2 (in step S102 shown in FIG. 5). In this context, "at a first frequency f1" means when driving an alternating input current $i(f_{1,t})$ with the first frequency $f_1$ into the battery 1, and "at a second frequency f2" means when driving an alternating input current $i(f_{2,t})$ with the second frequency $f_2$ into the battery 1. Further, the method includes (in step S103 shown in FIG. 5) calculating a frequency $f_0$ where the imaginary part $Im\{Z(f_0)\}$ of the battery impedance equals a predefined value P based on the imaginary parts $Im\{Z(f_1)\}$, $Im\{Z(f_2)\}$ obtained at the first frequency $f_1$ and the second frequency $f_2$. According to one example, the predefined value P is zero (P=0). If the predefined value P is zero the frequency $f_0$ is a zero intercept frequency (ZIF) as it defines a frequency at which the imaginary part is zero. As this ZIF is obtained by a calculation, such as an extrapolation based on two measured imaginary parts $Im\{Z(f_1)\}$, $Im\{Z(f_2)\}$, the frequency $f_0$ may be referred to as extrapolated zero intercept frequency (EZIF).

Based on the calculated frequency $f_0$ the battery temperature can be detected (in step S104 in FIG. 5). Determining the battery temperature based on the frequency $f_0$ may include looking up the temperature in a look-up table that holds a plurality of frequency-temperature pairs, wherein each of these frequency-temperature pairs includes a certain temperature and an associated frequency. The "associated frequency" is the frequency at which, at the certain temperature, the imaginary part of the battery impedance equals the predefined value P. These temperature-frequency pairs are the same for each battery type so that a look-up table for each battery type may be generated (by the battery manufacturer, for example) based on measurements applied to one or more batteries of this type. Those measurements may include detecting the imaginary part of the battery impedance at a plurality of different frequencies and at a plurality of different (known) battery temperatures and detecting, at each of the plurality of temperatures, the frequency at which the imaginary part equals the predefined value P. During these measurements, the battery temperature may be obtained using a temperature sensor arranged inside the battery.

In the following the imaginary part $Im\{Z(f_1)\}$ obtained at the first frequency $f_1$ is briefly referred to as first imaginary part $Im_1$, and the imaginary part $Im\{Z(f_2)\}$ obtained at the second frequency $f_2$ is briefly referred to as second imaginary part $Im_2$. Calculating the frequency $f_0$ at which the imaginary part equals P based on the first imaginary part $Im_1$ and the second imaginary part $Im_2$ is based on the fact that, at one temperature, the imaginary part of the battery impedance $Z(f)$ is essentially linearly dependent on the frequency f, that is, the imaginary parts obtained at different frequencies are essentially located on a straight line in a diagram that shows the imaginary part over the frequency, such as a diagram of the type shown in FIG. 3. Based on this, the frequency $f_0$ may be calculated based on the first imaginary part $Im_1$, the second imaginary part $Im_2$, the first frequency $f_1$, the second frequency $f_2$, and the predefined value P as follows:

$$f_0 = f_1 - \frac{Im_1 - P}{Im_2 - Im_1} \cdot (f_2 - f_1). \quad (4)$$

This is based on the assumption that the imaginary part $Im\{Z(f)\}$ of the battery impedance can approximately be expressed by a linear function (first order function) as follows:

$$Im\{Z(f)\} = P + \left(\frac{Im_2 - Im_1}{f_2 - f_1}\right) \cdot f. \quad (5)$$

Calculating $f_0$ based on only two imaginary parts, such as the first imaginary part $Im_1$ and the second imaginary part $Im_2$ explained above, is only an example. According to another example, the method includes obtaining two or more imaginary parts $Im_1$, $Im_2$, $Im_n$ at different frequencies $f_1$, $f_2$, $f_n$, calculating a linear or non-linear function of the imaginary part $Im\{Z(f)\}$ based on these imaginary parts $Im_1$, $Im_2$, $Im_n$ and, based on the linear function or the non-linear function, calculating the frequency where the imaginary part $Im\{Z(f)\}$ equals P, that is, calculating $f_0$ so that $Im\{Z(f_0)\}=P$.

Figure 6:
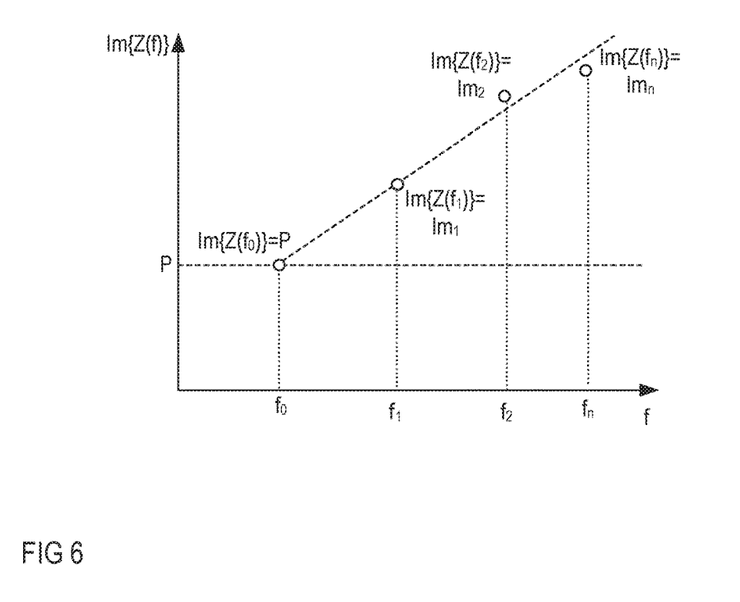
FIG. 6 illustrates one example of how a frequency at which the imaginary part of the battery equals a predefined value can be obtained based on imaginary parts of the battery impedance obtained at more than two different frequencies.

According to one example, a linear function is calculated based on the plurality of imaginary parts $Im_1$, $Im_2$, $Im_n$. This is illustrated in FIG. 6. FIG. 6 shows n imaginary parts $Im_1$, $Im_2$, $Im_n$ obtained at different frequencies $f_1$, $f_2$, $f_n$ and a straight line (drawn as dashed line) that represents the linear function based on which $f_0$ is calculated. Just for the purpose of illustration, n=3 in the example shown in FIG. 6; any number higher than n=3 may be used as well. The linear function may be calculated based on a "least square method" (LSM). Such method is known so that no further explanations are required. According to another example (not shown), a non-linear function is calculated based on n, where n≥3, imaginary parts. In particular this example includes calculating a function of order n−1 based on n imaginary parts as follows:

$$Im\{Z(f)\} = a_n f^n + a_{n-1} f^{n-1} + \ldots + a_1 f + a_0 \quad (6),$$

and calculating $f_0$ based on this function such that $Im\{Z(f_0)\}=P$. It is commonly known how based on n values, such as n imaginary parts explained above, a non-linear function of order n−1 can be calculated. Thus, no further explanations are required in this regard.

In the method explained with reference to FIGS. 4 and 5, the imaginary part of the battery impedance is to be detected (measured) only at two different frequencies, the first frequency $f_1$ and the second frequency $f_2$ explained before, wherein, referring to FIG. 6, more than two measurements at different frequencies $f_1$, $f_2$, $f_n$ may be performed. The at least two frequencies $f_1$, $f_2$, $f_n$ may be chosen arbitrarily. In particular, these frequencies may be chosen from a frequency range that, usually, is not effected by interferences in an application environment of the battery. According to one example, the at least two frequencies $f_1$, $f_2$, $f_n$ are each selected from a range of between 100 Hz and 10 kHz, in particular between 1 kHz and 10 kHz.

Figure 7:
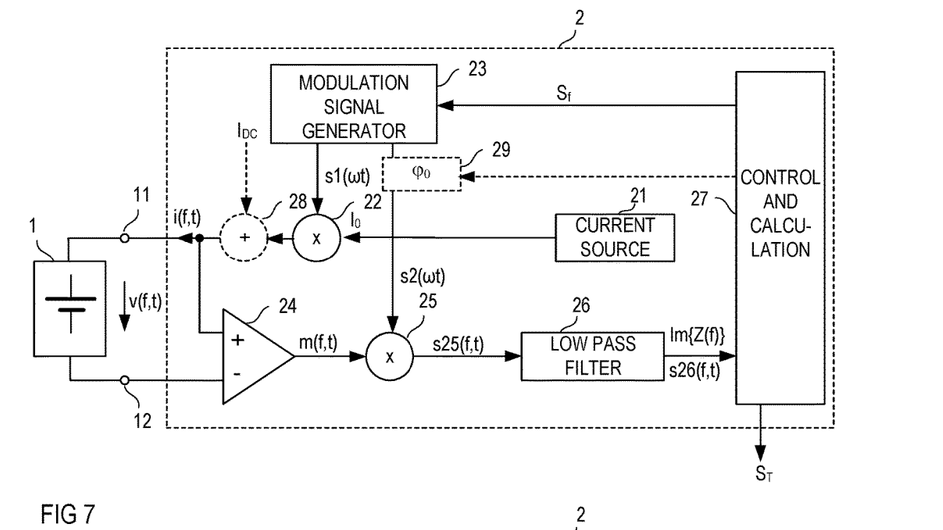
FIG. 7 shows a temperature detection circuit according to one example.

FIG. 7 shows one example of a temperature detection circuit 2 that is configured to detect the battery temperature based on one of the methods explained with reference to FIGS. 4, 5 and 6. FIG. 7 shows a block diagram of the temperature detection circuit 2. It should be noted that this block diagram illustrates the functional blocks of the temperature detection circuit 2 rather than a specific implementation. Those functional blocks can be implemented in various ways. According to one example, these functional blocks are implemented using dedicated circuitry, such as analog circuits, digital circuits or analog and digital circuits. According to another example, the temperature detection circuit 2 is implemented using hardware and software. For example, the temperature detection circuit 2 includes a microcontroller and software running on the microcontroller.

Referring to FIG. 7, the temperature detection circuit 2 includes a current source 21 configured to provide a direct current with a current level $I_0$. A modulator 22 connected downstream current source 21 is configured to modulate the current $I_0$ provided by the current source 21 with a first alternating signal $s1(\omega t)$. Optionally, the DC offset $I_{DC}$ is added to an output signal of the modulator 22 by an optional adder 28. The current i(f,t) driven into the battery 1 is available at an output of the modulator 22 or an output of the adder 28. In general, this current i(f,t) is given by $$i(f,t) = I_{DC} + I_0 \cdot s1(\omega t) \quad (5).$$

According to one example, the first alternating signal $s1(\omega t)$ is a sinusoidal signal, so that the input current i(f,t) is given by equation (1). This, however, is only an example. Other alternating signal waveforms such as a rectangular waveform may be used as well. The first alternating signal $s1(\omega t)$ is generated by a modulation signal generator 23 in accordance with a frequency signal $S_f$ provided by a control and calculation circuit 27. The frequency signal $S_f$ defines the frequency of the alternating signal $s1(\omega t)$ provided by the modulation signal generator 23.

Referring to FIG. 7, the temperature detection circuit 2 further includes a measurement unit 24 coupled to the battery nodes 11, 12 and configured to measure the battery voltage v(f,t). An output signal m(f,t) provided by the measurement circuit 24 is proportional to the battery voltage v(f,t) and is given by $$m(f,t) = A_0 \cdot v(f,t) \quad (6)$$

where $A_0$ is an amplification factor (gain) of the measurement unit 24. A demodulator 25 receives the measurement signal m(f,t) from the measurement unit 24 and a second alternating signal $s2(\omega t)$. The second alternating signal $s2(\omega t)$ is also generated by the modulation signal generator 23 and is a phase shifted version of the first alternating signal $s1(\omega t)$. According to one example a phase shift between the first alternating signal $s1(\omega t)$ and the second alternating signal $s2(\omega t)$ is 90° ($=\pi/2$), so that $$s2(\omega t) = s1\left(\omega t \mp \frac{\pi}{2}\right) \quad (7)$$

According to one example, $s1(\omega t) = \sin(\omega t)$ and $s2(\omega t) = \cos(\omega t)$. In this example, an output signal $s25(f,t)$ of the demodulator 25 is given by $$s25(f,t) = A_0 \cdot v(f,t) \cdot \cos(\omega t) =$$

$$= A_0 \cdot [V_0 + Z_0 \cdot (I_{DC} + I_0 \cdot \sin(\omega t + \varphi))] \cdot \cos(\omega t) \quad (8a).$$

Using trigonometrical formulae, equation (8a) can be written as $$s25(f,t) = \quad (8b)$$
$$A_0 \cdot \left[(V_0 + Z_0 \cdot I_{DC})\cos(\omega t) + \frac{Z_0 \cdot I_0}{2}(\sin(2\omega t + \varphi)) + \sin(\varphi))\right].$$

Referring to FIG. 7, the demodulator output signal $s25(f,t)$ is received by a low pass filter 26. A cut of frequency of this low pass filter 26 is such that alternating components (that is, components with the frequency $\omega t$ or multiples of this frequency) of the demodulator output signal $s25(f,t)$ are filtered out, so that an output signal of the low pass filter 26 is given by $$s26(f,t) = A_0 \cdot \left[\frac{Z_0 I_0}{2} \cdot \sin(\varphi)\right], \quad (9)$$

which, referring to equation (3) is a scaled version of the imaginary part of the battery impedance Z(f). The low pass filter may be any type of low pass filter. According to one example, the low pass filter is a CIC (Cascaded Integrator Comb) filter.

Referring to FIG. 7, The low pass filter output signal $s26(f,t)$ is received by the control and calculation circuit 27. The control and calculation circuit 27 is configured to control the modulation signal generator 23 such that in a first phase of the temperature detection process the modulation signal generator generates the first and second alternating signals $s1(\omega t)$, $s2(\omega t)$ with the first frequency $f_1$. In this first phase, the low pass filter output signal $s26(f,t)$ received by the control and calculation circuit 27 is proportional to the first imaginary part $Im_1$ of the battery impedance, wherein a proportionality factor $$\frac{A_0 \cdot I_0}{2}$$

is defined by the gain $A_0$ of the measurement unit 24. In a second phase of the temperature detection process, the control and calculation circuit 27 controls the modulation signal generator 23 to generate the first and second alternating signals $s1(\omega t)$, $s2(\omega t)$ with the second frequency $f_2$. Thus, in second phase the low pass filter signal $s26(f,t)$ received by the control and calculation circuit 27 is proportional to the second imaginary part $Im_2$ of the battery impedance. Based on these imaginary parts that are proportional to the first and second imaginary parts $Im_1$, $Im_2$ the control and calculation circuit 27 calculates the frequency $f_0$ at which the imaginary part of the battery impedance equals the predefined value P. The control and calculation circuit 27 may calculate $f_0$ based on equation (4), wherein the low pass filter output signal received by control and calculation circuit 27 may be divided by the proportionality factor $$\frac{A_0 \cdot I_0}{2}$$

before applying equation (4) in order to calculate $f_0$.

If, for example, the predefined value P is zero (P=0) such division is not required, that is, the scaled versions $$\frac{A_0 I_0}{2}\sin(\varphi(f_1)) \text{ and } \frac{A_0 I_0}{2}\sin(\varphi(f_2))$$

may be used in equation (4) instead of $Im_1 = \sin(\varphi(f_1))$ and $Im_2 = \sin(\varphi(f_2))$. The reason is that, if P=0, equation (4) can be written as $$f_0 = f_1 - \frac{Im_1}{Im_2 - Im_1} \cdot (f_2 - f_1), \text{ and} \quad (10)$$

$$\frac{Im_1}{Im_2 - Im_1} = \frac{\frac{A_0 I_0}{2} Im_1}{\frac{A_0 I_0}{2} Im_2 - \frac{A_0 I_0}{2} Im_1}. \quad (11)$$

For the same reason, the method, if P=0, is very robust if it comes to variations of the amplification factor A of the measurement unit. Those variations may include variations either during operation of one temperature detection circuit or different amplification factors in different temperature detection circuits.

According to one example, the control and calculation circuit 27 further includes a look-up table and is configured to look up a temperature associated with the calculated frequency $f_0$, and to output a temperature signal $S_T$ that represents the temperature associated with the calculated frequency $f_0$.

The explanation provided above is based on the assumption that the only phase shift the amplifier output signal m(f,t) has relative to the first alternating signal s1(ωt) is the phase shift φ resulting from the battery 1. However, there may be an additional phase shift $φ_0$ resulting from the temperature measurement circuit 2 itself, that is, for example, the amplifier 24, the modulator 22 and the optional adder 28. Thus, the amplifier output signal m(f,t) may in fact be given by $$m(f,t)=A_0 \cdot [V_0+Z_0 \cdot (I_{DC}+I_0 \cdot \sin(\omega t+\varphi_0+\varphi))] \tag{12}$$

The phase shift $φ_0$ introduced by the temperature measurement circuit 2 may be compensated in various ways. Some examples are explained below. In two of these examples, the phase shift $φ_0$ is measured in a calibration step before the temperature measurement circuit 2 is used to measure the battery temperature. The calibration step may include coupling an ohmic resistor instead of a battery 1 to the temperature measurement circuit 2 and calculating the phase shift $φ_0$ based on the low pass filter output signal s26(f,t) which, in the calibration step, is given by $$s26(f, t) = A_0 \cdot \left[\frac{R_0 I_0}{2} \cdot \sin(\varphi_0)\right], \tag{13}$$

where $R_0$ is a resistance of the resistor used in the calibration step. Based on equation (13), which is based on equation (9), the phase shift $φ_0$ may be calculated by $$\varphi_0 = \arcsin\left(\frac{2 \cdot s26(f, t)}{A \cdot {}_0 R_0 \cdot I_0}\right). \tag{14}$$

According to one example that is illustrated in dashed lines in FIG. 7, the temperature measurement circuit 2 includes a phase shifter 29 that receives the second alternating signal s2(ωt) and provides a phase shifted version s2(ωt+$φ_0$) of the second alternating signal to the demodulator 25, wherein the phase shifted version s2(ωt+$φ_0$) of the second alternating signal takes into account the phase shift $φ_0$ measured in the calibration process. The phase shift introduced by the temperature measurement circuit may be dependent on the frequency so that $φ_0=φ_0(f)$. In this case, a calibration step may be performed at those different frequencies $f_1$, $f_2$ of the input current i(f,t) at which the at least two imaginary parts $Im_1$, $Im_2$ are obtained in operation of the temperature measurement circuit. In each calibration step one phase shift $φ_0(f_1)$, $φ_0(f_2)$ associated with the respective frequency $f_1$, $f_2$ is obtained and stored in the control and calculation circuit 27. In this case, during a temperature measurement operation of the temperature measurement circuit 2, the phase shifter 29 receives the correct phase shift information from the control and calculation circuit 27 in each of the at least two measurement phases in which the input current i(f,t) has different frequencies f1, f2.

Figure 8:
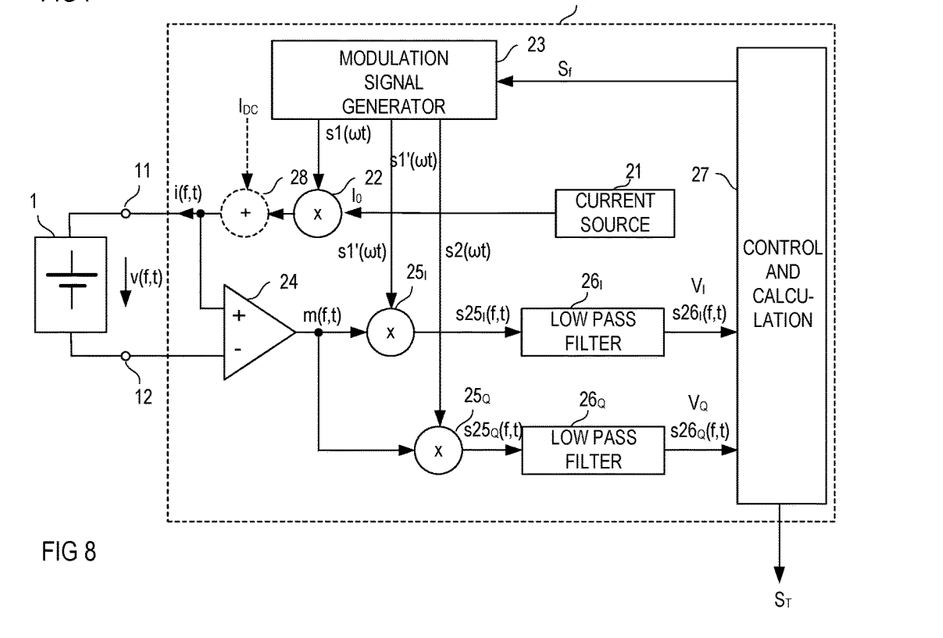
FIG. 8 shows a temperature detection circuit according to another example.

FIG. 8 shows a modification of the temperature detection circuit 2 shown in FIG. 7. The temperature detection circuit shown in FIG. 8 is different from the one shown in FIG. 7 in that it includes a first demodulator $25_I$ and a second demodulator $25_Q$ that each receive the measurement signal m(f,t). A first low pass filter $26_I$ is connected downstream the first demodulator $25_I$, and a second low pass filter $26_Q$ is connected downstream the second demodulator $25_Q$. The first demodulator $25_I$ receives a third alternating signal s1'(ωt) and the second demodulator $25_Q$ receives the second alternating signal s2(ωt). The third alternating signal s1'(ωt) and the second alternating signal s2(ωt) are selected such that there is a phase shift of π/2 (=90°) between the third alternating signal s1'(ωt) and the second alternating signal s2(ωt). The third alternating signal s1'(ωt) may be in phase with the first alternating signal s1(ωt). This, however, is not mandatory. If there is a phase shift between the first signal s1(ωt) and the third signal s1'(ωt) such phase shift can be considered as part of the phase shift introduced by the temperature detection circuit and is compensated by the mechanism explained below. According to one example, the third alternating signal s1'(ωt) and the second alternating signal s2(ωt) have a sinusoidal waveform so that, for example, s1'(ωt)=sin(ωt) and s2(ωt)=cos(ωt). In this case, output signals $s25_I(f,t)$, $s25_Q(f,t)$ of the demodulators $25_I$, $25_Q$ are as follows:

$$s25_I(f,t)=A_0 \cdot v(f,t) \cdot s1'(\omega t)=A_0 \cdot v(f,t) \cdot \sin(\omega t) \tag{15a}$$

$$s25_Q(f,t)=A_0 \cdot v(f,t) \cdot s2(\omega t)=A_0 \cdot v(f,t) \cdot \cos(\omega t) \tag{15b}$$

If the input current i(f,t) is a sinusoidal current, the first alternating signal s1(ωt) and the third alternating signal s1'(ωt) may be identical. If, for example, v(f,t) is in accordance with equation (2) and there is an additional phase shift $φ_0$ introduced by the temperature detection circuit 2 the demodulator output signals $s25_I(f,t)$, $s25_Q(f,t)$ are $$s25_I(f,t)=A_0 \cdot [V_0+Z_0 \cdot (I_{DC}+I_0 \cdot \sin(\omega t+\varphi_0+\varphi))] \cdot \sin(\omega t) \tag{16a}$$

$$s25_Q(f,t)=A_0 \cdot [V_0+Z_0 \cdot (I_{DC}+I_0 \cdot \sin(\omega t+\varphi_0+\varphi))] \cdot \cos(\omega t) \tag{16b}$$

The low pass filters $26_I$, $26_Q$ are configured to filter signal components with a frequency ωt and higher. Output signals $s26_I(f,t)$, $s26_Q(f,t)$, which are also referred to as inphase component $V_I$ and quadrature component $V_Q$ in the following, of these low pass filters $26_I$, $26_Q$ are given by $$s26_I(f, t) = V_I = \frac{A_0 \cdot Z_0 \cdot I_0}{2}\cos(\varphi_0 + \varphi) \tag{17a}$$

$$s26_Q(f, t) = V_Q = \frac{A_0 \cdot Z_0 \cdot I_0}{2}\sin(\varphi_0 + \varphi). \tag{17b}$$

According to one example, the control and calculation circuit 27 is configured to divide the inphase and quadrature component by $$\frac{I_0}{2}$$

to obtain $$s26_I'(f,t)=V_I'=A_0 \cdot Z_0 \cdot \cos(\varphi_0+\varphi) \tag{18a}$$

$$s26_Q'(f,t)=V_Q'=A_0 \cdot Z_0 \cdot \sin(\varphi_0+\varphi) \tag{18b},$$

wherein these signals (values) can be considered as the real part and the imaginary part of a product of a complex impedance Z of the battery 1 and a complex gain A of the amplifier 24. The complex gain also takes into account the overall phase shift $\varphi_0$ introduced by the temperature detection circuit 2. Thus, $$V_I' + jV_Q' = A \cdot Z = (A_0 \cdot e^{j\varphi_0}) \cdot (Z_0 \cdot e^{j\varphi}) \tag{19}$$

According to one example, the complex gain A, which includes the magnitude $A_0$ and the phase shift $\varphi_0$, is determined in one or more calibration steps and stored in the control and calculation unit. Based on $A_0$ and $\varphi_0$ and on $V_I'$ and $V_Q'$ the control and calculation unit circuit 27 may calculate the magnitude $Z_0$ and phase $\varphi$ of the battery resistance Z as follows:

$$Z_0 = \frac{\sqrt{(V_I')^2 + (V_Q')^2}}{A_0} \tag{20a}$$

$$\varphi = \arctan\left(\frac{V_Q'}{V_I'}\right) - \varphi_0. \tag{20b}$$

Referring to the above, the magnitude $Z_0$ and phase $\varphi$ are dependent on the frequency, that is, $Z_0 = Z_0(f)$ and $\varphi = \varphi(f)$ so that the control and calculation circuit 27 calculates $Z_0$ and $\varphi$ at at least two different frequency f1, f2 and calculates the imaginary part Im{Z(f)} at each of these frequencies based on $$\text{Im}\{Z(f)\} = Z_0 \cdot \sin(\varphi) \tag{21}.$$

The complex gain A may be dependent on the frequency, that is, $A_0 = A_0(f)$ and $\varphi_0 = \varphi_0(f)$. In this case, $A_0(f)$ and $\varphi_0(f)$ may be obtained in a calibration routine for each of the at least two frequencies $f_1$, $f_2$ and stored in the control and calculation circuit 27. The control and calculation circuit 27 then, for example, uses $A_0(f1)$ and $\varphi_0(f1)$ to calculate $Z_0(f1)$ and $\varphi(f1)$ based on equations (20a) and (20b) and $A_0(f2)$ and $\varphi_0(f2)$ to calculate $Z_0(f2)$ and $\varphi(f2)$ based on equations (20a) and (20b). The calibration routine may include connecting an ohmic resistor with a resistance $R_0$ instead of a battery to the temperature detection circuit 2. Signals $s26_I'(f,t)$ and $s26_Q'(f,t)$ explained with reference to equations (18a) and (18b) are then given by $$s26_I'(f,t) = V_I' = A_0 \cdot R_0 \cdot \cos(\varphi_0) \tag{22a}$$

$$s26_Q'(f,t) = V_Q' = A_0 \cdot R_0 \cdot \sin(\varphi_0) \tag{22b}.$$

Based on these signals $s26_I'(f,t)$ and $s26_Q'(f,t)$ magnitude $A_0$ and phase $\varphi_0$ of the complex amplification may be calculated by $$A_0 = \frac{\sqrt{(V_I')^2 + (V_Q')^2}}{R_0} \tag{23a}$$

$$\varphi_0 = \arctan\left(\frac{V_Q'}{V_I'}\right). \tag{23b}$$

Although equations (15a) to (23b) illustrate/explain a method of detecting the imaginary part of the battery resistance based on a sinusoidal input current i(f,t) the method is not restricted to a sinusoidal input current, but any other type of alternating input current, such as a rectangular input current may be used as well. In each case the second and third alternating signals s2(ωt) and s1'(ωt) can be sinusoidal signals, such as s2(ωt)=cos(ωt) and s1'(ωt)=sin(ωt).

Figure 9:
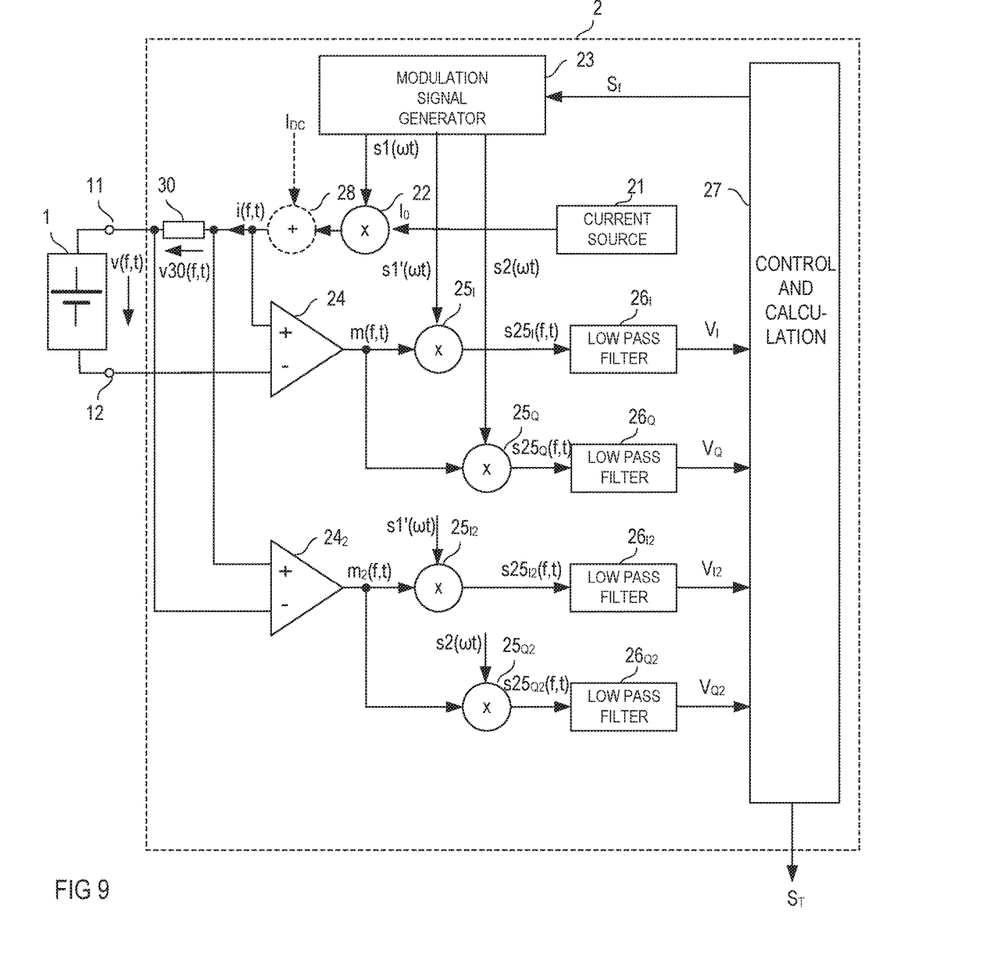
FIG. 9 shows a temperature detection circuit according to yet another example.

FIG. 9 shows a modification of the temperature detection circuit 2 shown in FIG. 8. Besides measuring the voltage v(f,t) across the battery 1 the temperature detection circuit 2 shown in FIG. 9 also measures the input current i(f,t). For this, a current sense resistor 30 is connected in series with the modulator 22. A sense voltage v30(f,t) across the resistor is proportional to the input current i(f,t), $$v30(f,t) = R_{30} \cdot i(f,t) \tag{24},$$

where $R_{30}$ is a resistance of the sense resistor. The sense voltage v30(f,t) is processed in the same way as the battery voltage v(f,t). That is, a further sense amplifier 24₂ receives the sense voltage v30(f,t) and provides a further measurement signal m2(f,t). A third modulator 2512 modulates the further measurement signal m2(f,t) with the third alternating signal s1'(ωt) and a fourth modulator 25_{Q2} modulates the further measurement signal m2(f,t) with the second alternating signal s2(ωt). An output signal $s25_{I2}(f,t)$ of the third modulator 2512 is filtered by a third low pass filter 26_{I2}, and an output signal $s25_{Q2}(f,t)$ of the fourth modulator 25_{Q2} is filtered by a fourth low pass filter 26_{Q2}. Based on what is explained in context with equations (17a) and (17b) above it can be shown that the output signals (output values) of the first to fourth low pass filters 26_I, 26_Q, 26_{I2}, 26_{Q2} are as follows:

$$V_I = \frac{A_0 \cdot Z_0 \cdot I_0}{2} \cos(\varphi_0 + \varphi) \tag{25a}$$

$$V_Q = \frac{A_0 \cdot Z_0 \cdot I_0}{2} \sin(\varphi_0 + \varphi) \tag{25b}$$

$$V_{I2} = \frac{A_{02} \cdot R_{30} \cdot I_0}{2} \cos(\varphi_{02}) \tag{25c}$$

$$V_{Q2} = \frac{A_{02} \cdot R_{30} \cdot I_0}{2} \sin(\varphi_{02}) \tag{25d}$$

According to one example, the sense amplifiers 24, 24₂ are sense amplifiers of the same type with the same complex gain, so that $A_{02} = A_0$ and $\varphi_0 = \varphi_{02}$. In this case, $A_0$ and $\varphi_0$ can be calculated by the control and calculation circuit 27 based on $V_{I2}$ and $V_{Q2}$ as follows:

$$A_0 = A_{02} = 2 \cdot \frac{\sqrt{(V_{I2})^2 + (V_{Q2})^2}}{R_{30} \cdot I_0} \tag{23a}$$

$$\varphi_0 = \varphi_{02} = \arctan\left(\frac{V_{Q2}}{V_{I2}}\right). \tag{23b}$$

Thus, in this example, a calibration routine is not required but $A_0$ and $\varphi_0$ are calculated by the control and calculation circuit 27 during the temperature measurement operation of the temperature detection circuit 27. Further, control and calculation circuit 27 calculates the imaginary part of the battery impedance Z(f) at each of the at least two frequencies based on equations (20a), (20b), and (21).

Figure 10:
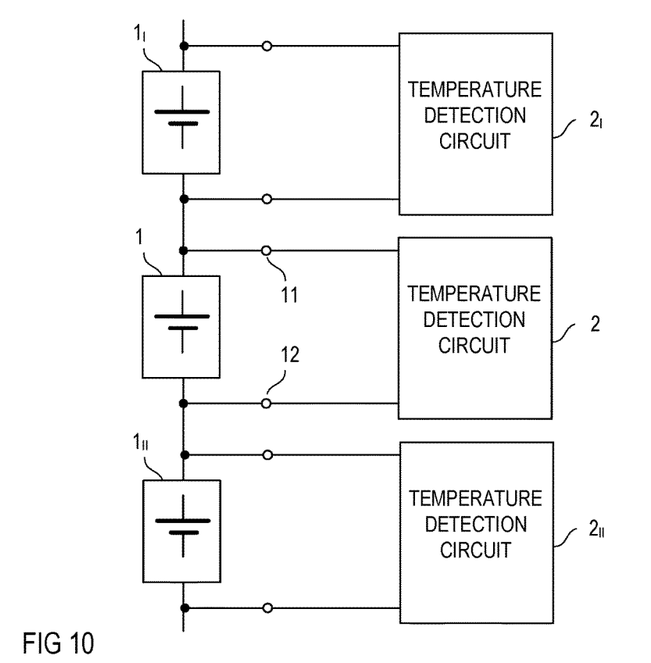
FIG. 10 shows an arrangement with a plurality of batteries connected in series and a plurality of battery detection circuits.

Referring to FIG. 10, the battery 1 explained before may be part of a battery arrangement with a plurality of batteries 1, 1_I, 1_II connected in series. A temperature detection circuit 2, 2_I, 2_II may be connected to each of these batteries, wherein each of these temperature detection circuits 2, 2_I, 2_II is configured to detect the temperature of the battery 1, 1_I, 1_II it is connected to.

Figure 11:
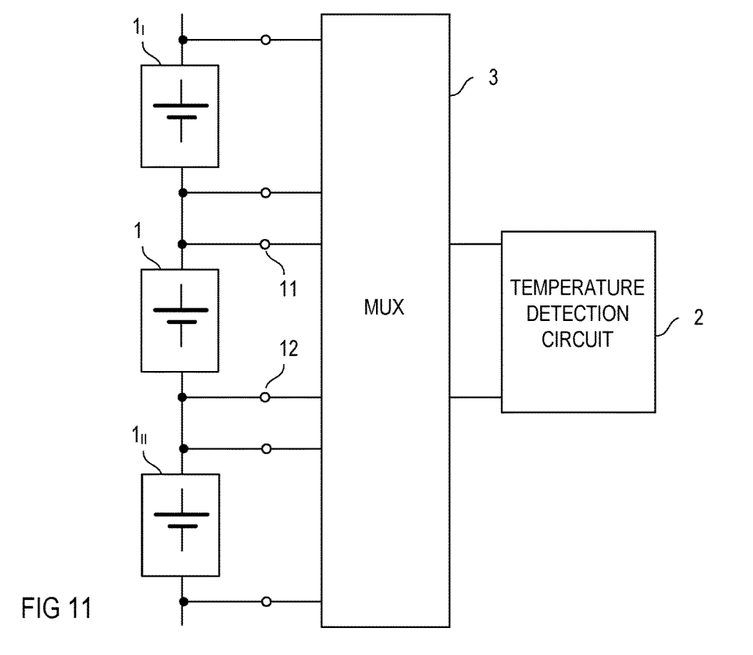
FIG. 11 shows an arrangement with a plurality of batteries connected in series and one temperature detection circuit.

FIG. 11 shows a modification of the arrangement shown in FIG. 10. In the arrangement shown in FIG. 11 there is only one temperature detection circuit 2 and a multiplexer 3. The multiplexer 3 is connected between the battery arrangement with the plurality of batteries 1, $1_I$, $1_{II}$ and the temperature detection circuit 2. This multiplexer 3 is configured, at each time, to connect the temperature detection circuit with one of the several batteries 1, $1_I$, $1_{II}$ and, in a timely successive fashion, connect the individual batteries 1, $1_I$, $1_{II}$ of the arrangement to the temperature detection circuit 2. By this, the temperature detection circuit 2 in a timely successive fashion detects the temperatures of the individual batteries 1, $1_I$, $1_{II}$ of the battery arrangement.

Figure 12:
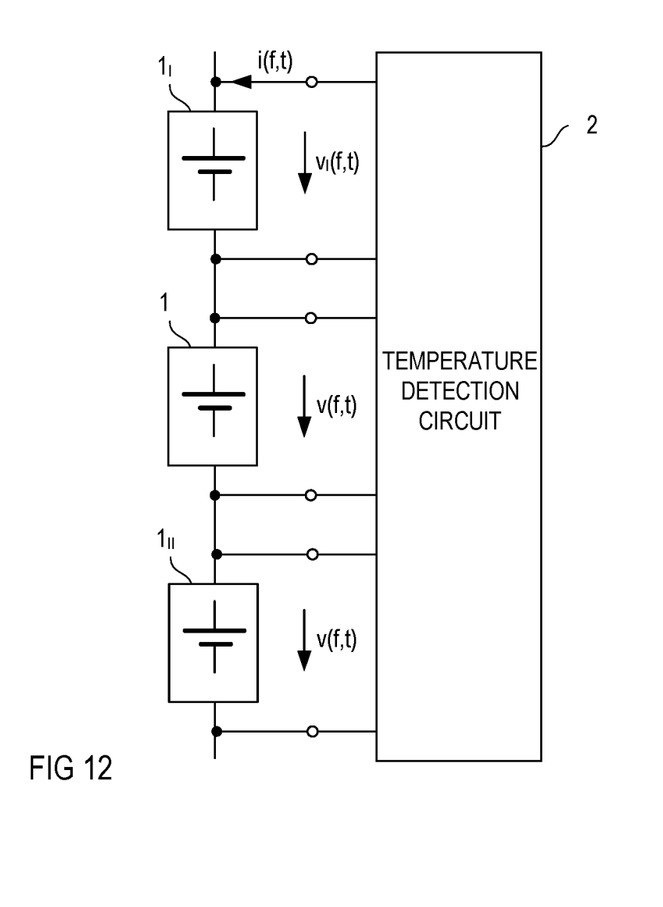
FIG. 12 shows an arrangement with a plurality of batteries connected in series and a temperature detection circuit according to a further example.

FIG. 12 shows a battery arrangement with a plurality of batteries $1_I$, 1, $1_{II}$ connected in series and a temperature detection circuit 2 according to another example. The temperature detection circuit shown in FIG. 12 is configured to drive one input current i(f,t) at at least two different frequencies $f_1$, $f_2$ into the battery series circuit, measure the voltage $v_I(f,t)$, $v(f,t)$, $v_{II}(f,t)$ across each battery $1_I$, 1, $1_{II}$, and detect a temperature of each battery $v_I(f,t)$, $v(f,t)$, $v_{II}(f,t)$ based on the measured voltage $v_I(f,t)$, $v(f,t)$, $v_{II}(f,t)$ in accordance with any of the methods explained before.

The following examples may illustrate one or more aspects of the disclosure.

Example 1

A method, including: driving an alternating input current with a first frequency into a battery and detecting an imaginary part of a battery impedance at the first frequency; driving an alternating current with a second frequency different from the first frequency into the battery and detecting an imaginary part of the battery impedance at the second frequency; and calculating an intercept frequency at which the imaginary part equals a predefined value at least based on the imaginary part obtained at the first frequency and the imaginary part obtained at the second frequency.

Example 2

The method of example 1, wherein the predefined value is zero.

Example 3

The method of example 1 or 2, wherein the predefined value is different from zero.

Example 4

The method of any combination of examples 1 to 3, further including: obtaining temperature information from a look-up table that includes a plurality of frequency-temperature information pairs.

Example 5

The method of any combination of examples 1 to 4, wherein calculating the intercept frequency includes: calculating a straight line based on the imaginary part obtained at the first frequency and the imaginary part obtained at the second frequency; and calculating the frequency at which the calculated straight line intercepts the predefined value.

Example 6

The method of any combination of examples 1 to 5, wherein detecting the imaginary part at each of the first and second frequencies includes: measuring a voltage across the battery to obtain a measurement signal; demodulating the measurement signal to obtain a demodulated measurement signal; and low pass filtering the demodulated measurement signal.

Example 7

The method of example 6, wherein detecting the imaginary part at each of the first and second frequencies further includes: measuring the alternating input current to obtain a further measurement signal; detecting a phase shift based on the further measurement signal; and detecting the imaginary part based on the measured voltage and the detected phase shift.

Example 8

The method of example 6 or 7, further including performing a calibration routine before detecting the imaginary part at each of the first and second frequencies, wherein the calibration routine includes detecting a phase shift, and
wherein detecting the imaginary part comprises detecting the imaginary part based on the measured voltage and the detected phase shift.

Example 9

The method of any combination of examples 6 to 8, wherein demodulating the measurement signal comprises multiplying the measurement signal with a sinusoidal signal.

Example 10

The method of example 9, wherein a phase shift between the alternating input current and the sinusoidal signal is 90°.

Example 11

The method of any combination of examples 6 to 10, wherein demodulating the measurement signal includes: multiplying the measurement signal with a first sinusoidal signal; and multiplying the measurement signal with a second sinusoidal signal, wherein a phase shift between the first sinusoidal signal and the second sinusoidal signal is 90°.

Example 12

The method of any combination of examples 1 to 11, further including: driving, at least once, an alternating current with a further frequency different from the first frequency and the second frequency into the battery and detecting an imaginary part of the battery impedance at the further frequency, so as to obtain an imaginary part at at least one further frequency; and calculating the intercept frequency additionally based on the imaginary part obtained at the at least one further frequency.

Example 13

The method of example 12, wherein calculating the intercept frequency includes calculating a linear function based on a least square method.

Example 14

The method of example 12, wherein calculating the intercept frequency includes calculating a non-linear function.

Example 15

The method of any combination of examples 1 to 14, wherein the battery includes at least one battery cell.

Example 16

The method of example 15, wherein the battery includes two or more battery cells connected in series.

Example 17

The method of example 15, wherein the battery includes two or more battery cells connected in parallel.

Example 18

The method of any combination of examples 1 to 17, wherein at least one additional battery is connected in series with the battery.

Example 19

A temperature detection circuit configured to drive an alternating current with a first frequency into a battery and detect an imaginary part of a battery impedance at the first frequency; drive an alternating current with a second frequency different from the first frequency into the battery and detect an imaginary part of the battery impedance at the second frequency; and calculate an intercept frequency at which the imaginary part equals a predefined value at least based on the imaginary part obtained at the first frequency and the imaginary part obtained at the second frequency.

Example 20

The temperature detection circuit of example 19, wherein the predefined value is zero.

Example 21

The temperature detection circuit of example 19, wherein the predefined value is different from zero.

Example 22

The temperature detection circuit of any combination of examples 19 to 21, wherein the temperature detection circuit is further configured to obtain temperature information from a look-up table that includes a plurality of frequency-temperature information pairs.

Example 23

The temperature detection circuit of any combination of examples 19 to 22, wherein the temperature detection circuit is configured to calculate the intercept frequency using the steps of calculating a straight line based on the imaginary part obtained at the first frequency and the imaginary part obtained at the second frequency; and calculating the frequency at which the calculated straight line intercepts the predefined value.

Example 24

The temperature detection circuit of any combination of examples 19 to 23, wherein the temperature detection circuit is configured to detect the imaginary part at each of the first and second frequencies using the steps of measuring a voltage across the battery to obtain a measurement signal; demodulating the measurement signal to obtain a demodulated measurement signal; and low pass filtering the demodulated measurement signal.

Example 25

The temperature detection circuit of example 24, wherein the temperature detection circuit is configured to detect the imaginary part at each of the first and second frequencies further using the steps of measuring the alternating input current to obtain a further measurement signal; detecting a phase based on the further measurement signal; and detecting the imaginary part based on the measured voltage and the detected phase shift.

Example 26

The temperature detection circuit of example 24 or 25, wherein the temperature detection circuit is further configured to perform a calibration routine before detecting the imaginary part at each of the first and second frequencies, wherein the calibration routine includes detecting a phase, and wherein detecting the imaginary part includes detecting the imaginary part based on the measured voltage and the detected phase shift.

Example 27

The temperature detection circuit of any combination of examples 19 to 26, wherein demodulating the measurement signal includes multiplying the measurement signal with a sinusoidal signal.

Example 28

The temperature detection circuit of example 27, wherein a phase shift between the alternating input current and the sinusoidal signal is 90°.

Example 29

The method of any combination of examples 19 to 28, wherein demodulating the measurement signal includes: multiplying the measurement signal with a first sinusoidal signal; and multiplying the measurement signal with a second sinusoidal signal, wherein a phase shift between the first sinusoidal signal and the second sinusoidal signal is 90°.

Example 30

The temperature detection circuit of any combination of examples 19 to 29, wherein the temperature detection circuit is further configured to drive, at least once, an alternating current with a further frequency different from the first frequency and the second frequency into the battery and detecting an imaginary part of the battery impedance at the further frequency, so as to obtain an imaginary part at at least one further frequency; and calculate the intercept frequency additionally based on the imaginary part obtained at the at least one further frequency.

Example 31

The temperature detection circuit of example 30, wherein calculating the intercept frequency includes calculating a linear function based on a least square method.

Example 32

The temperature detection circuit of example 30, wherein calculating the intercept frequency includes calculating a non-linear function.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Further, the methods of the invention may be achieved in either all software implementations, using the appropriate processor instructions, or in hybrid implementations that utilize a combination of hardware logic and software logic to achieve the same results. Such modifications to the inventive concept are intended to be covered by the appended claims.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second" and the like, are also used to describe various elements, regions, sections, etc. and are also not intended to be limiting. Like terms refer to like elements throughout the description.

As used herein, the terms "having," "containing," "including," "comprising" and the like are open ended terms that indicate the presence of stated elements or features, but do not preclude additional elements or features. The articles "a," "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

The invention claimed is:

1. A method comprising:
    driving an alternating input current with a first frequency into a battery, the first frequency having a first predetermined value, and detecting a first imaginary part of an impedance of the battery at the first frequency;
    driving the alternating input current with a second frequency into the battery, the second frequency having a second predetermined value different from the first predetermined value of the first frequency, and detecting a second imaginary part of the impedance of the battery at the second frequency; and
    calculating, by a control and calculation circuit, an intercept frequency at which a third imaginary part of the impedance of the battery at the intercept frequency equals a predefined value at least based on the first imaginary part of the impedance of the battery at the first frequency and the second imaginary part of the impedance of the battery at the second frequency.

2. The method of claim 1, wherein the predefined value is zero.

3. The method of claim 1, wherein the predefined value is different from zero.

4. The method of claim 1, further comprising obtaining temperature information from a look-up table that includes a plurality of frequency-temperature information pairs.

5. The method of claim 1, wherein calculating the intercept frequency comprises:
    calculating a straight line based on the first imaginary part of the impedance of the battery at the first frequency and the second imaginary part of the impedance of the battery at the second frequency; and
    calculating the intercept frequency at which the calculated straight line intercepts the predefined value.

6. The method of claim 1, wherein detecting the first imaginary part of the impedance of the battery and the second imaginary part of the impedance of the battery at each of the first and second frequencies comprises:
    measuring a voltage across the battery to obtain a measurement signal;
    demodulating the measurement signal to obtain a demodulated measurement signal; and
    low pass filtering the demodulated measurement signal.

7. The method of claim 6, wherein detecting the first imaginary part of the impedance of the battery and the second imaginary part of the impedance of the battery at each of the first and second frequencies further comprises:
    measuring the alternating input current to obtain a further measurement signal;
    detecting a phase shift based on the further measurement signal; and
    detecting the respective imaginary part of the impedance of the battery based on the measured voltage and the detected phase shift.

8. The method of claim 6, further comprising performing a calibration routine before detecting the first imaginary part of the impedance of the battery and the second imaginary part of the impedance of the battery at each of the first and second frequencies,
    wherein the calibration routine comprises detecting a phase shift, and
    wherein detecting the respective imaginary part of the impedance of the battery comprises detecting the imaginary part of the impedance of the battery based on the measured voltage and the detected phase shift.

9. The method of claim 6, wherein demodulating the measurement signal comprises multiplying the measurement signal with a sinusoidal signal.

10. The method of claim 9, wherein a phase shift between the alternating input current and the sinusoidal signal is 90°.

11. The method of claim 6, wherein demodulating the measurement signal comprises:
    multiplying the measurement signal with a first sinusoidal signal; and
    multiplying the measurement signal with a second sinusoidal signal, wherein a phase shift between the first sinusoidal signal and the second sinusoidal signal is 90°.

12. The method of claim 1, further comprising:
driving, at least once, the alternating input current with a further frequency into the battery, the further frequency having a further predetermined value different from the first predetermined value of the first frequency and the second predetermined value of the second frequency, and detecting a further imaginary part of the impedance of the battery at the further frequency; and wherein the intercept frequency is further calculated based on the further imaginary part of the impedance of the battery at the further frequency.

13. The method of claim 12, wherein calculating the intercept frequency comprises calculating a linear function based on a least square method.

14. The method of claim 12, wherein calculating the intercept frequency comprises calculating a non-linear function.

15. The method of claim 1, wherein the battery comprises at least one battery cell.

16. The method of claim 15, wherein the battery comprises two or more battery cells connected in series.

17. The method of claim 15, wherein the battery comprises two or more battery cells connected in parallel.

18. The method of claim 1, wherein at least one additional battery is connected in series with the battery.

19. A temperature detection circuit comprising a control and calculation circuit, wherein the temperature detection circuit is configured to:
drive an alternating current with a first frequency into a battery, the first frequency having a first predetermined value, and detect a first imaginary part of an impedance of the battery at the first frequency; and drive the alternating current with a second frequency into the battery, the second frequency having a second predetermined value different from the first predetermined value of the first frequency, and detect a second imaginary part of the impedance of the battery at the second frequency, wherein the control and calculation circuit is configured to calculate an intercept frequency at which a third imaginary part of the impedance of the battery at the intercept frequency equals a predefined value at least based on the first imaginary part of the impedance of the battery at the first frequency and the second imaginary part of the impedance of the battery at the second frequency.

20. The temperature detection circuit of claim 19, wherein the predefined value is zero.

21. The temperature detection circuit of claim 19, wherein the predefined value is different from zero.

22. The temperature detection circuit of claim 19, wherein the temperature detection circuit is further configured to obtain temperature information from a look-up table that includes a plurality of frequency-temperature information pairs.

23. The temperature detection circuit of claim 19, wherein the temperature detection circuit is configured to calculate the intercept frequency using the steps of:
calculating a straight line based on the first imaginary part of the impedance of the battery at the first frequency and the second imaginary part of the impedance of the battery at the second frequency; and
calculating the intercept frequency at which the calculated straight line intercepts the predefined value.

24. The temperature detection circuit of claim 19, wherein the temperature detection circuit is configured to detect the first imaginary part of the impedance of the battery and the second imaginary part of the impedance of the battery at each of the first and second frequencies using the steps of:
measuring a voltage across the battery to obtain a measurement signal;
demodulating the measurement signal to obtain a demodulated measurement signal; and
low pass filtering the demodulated measurement signal.

25. The temperature detection circuit of claim 24, wherein the temperature detection circuit is configured to detect the first imaginary part of the impedance of the battery and the second imaginary part of the impedance of the battery at each of the first and second frequencies further using the steps of:
measuring the alternating current to obtain a further measurement signal;
detecting a phase based on the further measurement signal; and
detecting the respective imaginary part of the impedance of the battery based on the measured voltage and the detected phase shift.

26. The temperature detection circuit of claim 24, wherein the temperature detection circuit is further configured to perform a calibration routine before detecting the first imaginary part of the impedance of the battery and the second imaginary part of the impedance of the battery at each of the first and second frequencies,
wherein the calibration routine comprises detecting a phase, and
wherein detecting a respective imaginary part of the impedance of the battery comprises detecting the respective imaginary part of the impedance of the battery based on the measured voltage and the detected phase shift.

27. The temperature detection circuit of claim 24, wherein demodulating the measurement signal comprises multiplying the measurement signal with a sinusoidal signal.

28. The temperature detection circuit of claim 27, wherein a phase shift between the alternating current and the sinusoidal signal is 90°.

29. The temperature detection circuit of claim 24, wherein demodulating the measurement signal comprises:
multiplying the measurement signal with a first sinusoidal signal; and
multiplying the measurement signal with a second sinusoidal signal,
wherein a phase shift between the first sinusoidal signal and the second sinusoidal signal is 90°.

30. The temperature detection circuit of claim 19,
wherein the temperature detection circuit is further configured to drive, at least once, the alternating current with a further frequency into the battery, the further frequency having a further predetermined value different from the first predetermined value of the first frequency and the second predetermined value of the second frequency, and detect a further imaginary part of the impedance of the battery at the further frequency, and
wherein the control and calculation circuit is further configured to calculate the intercept frequency based on the imaginary part of the impedance of the battery at the further frequency.

31. The temperature detection circuit of claim 30, wherein the control and calculation circuit is configured to calculate the intercept frequency by calculating a linear function based on a least square method.

32. The temperature detection circuit of claim 30, wherein the control and calculation circuit is configured to calculate the intercept frequency by calculating a non-linear function.

\* \* \* \* \*